(12) United States Patent
Omori

(10) Patent No.: US 10,331,115 B2
(45) Date of Patent: Jun. 25, 2019

(54) SUBSTRATE PROCESSING SYSTEM, STORAGE MEDIUM AND DATA PROCESSING METHOD

(71) Applicant: ASM IP Holding B.V., Almere (NL)

(72) Inventor: Taku Omori, Akiruno (JP)

(73) Assignee: ASM IP Holding B.V., Almere (NL)

( * ) Notice: Subject to any disclaimer, the term of this patent is extended or adjusted under 35 U.S.C. 154(b) by 295 days.

(21) Appl. No.: 15/362,363

(22) Filed: Nov. 28, 2016

(65) Prior Publication Data

US 2018/0150069 A1 May 31, 2018

(51) Int. Cl.
*G05B 21/02* (2006.01)
*G06F 16/16* (2019.01)
*H01J 37/32* (2006.01)

(52) U.S. Cl.
CPC ........... *G05B 21/02* (2013.01); *G06F 16/164* (2019.01); *H01J 37/32926* (2013.01)

(58) Field of Classification Search
CPC ..................................................... G05B 21/02
See application file for complete search history.

(56) References Cited

U.S. PATENT DOCUMENTS

2009/0055013 A1    2/2009  Takizawa et al.

*Primary Examiner* — Douglas M Menz
(74) *Attorney, Agent, or Firm* — Studebaker & Brackett PC

(57) ABSTRACT

A substrate processing system includes a module controller that creates a log file in which a data count corresponding to timing of sampling operation data is added to the operation data of a module sampled in a predetermined sampling period, a main control apparatus that is connected to the module controller, receives the log file and start time information indicating a time at which collection of the operation data included in the log file starts from the module controller, converts the data count to a time stamp from the start time information and creates a data file including the time stamp and the operation data, and a host computer that receives the data file provided from the main control apparatus.

11 Claims, 4 Drawing Sheets

FIG. 2

RF ON time : 15:45:36.78
(start time)

Log File:

| Data Count | DI data | RF data | Additional AI data |
|---|---|---|---|
| 0 | - | - | - |
| 1 | - | - | - |
| ...... | - | - | - |
| 10 | - | - | - |
| ...... | - | - | - |

FIG. 3

| Data count | Formula (start time + 10ms * number of counts)*** | Converted timestamp data |
|---|---|---|
| 0 | 15:45:36.78 + 10ms * 0 | 15:45:36.780 |
| 1 | 15:45:36.78 + 10ms * 1 | 15:45:36.790 |
| 2 | 15:45:36.78 + 10ms * 2 | 15:45:36.800 |
| 3 | 15:45:36.78 + 10ms * 3 | 15:45:36.810 |
| 4 | 15:45:36.78 + 10ms * 4 | 15:45:36.820 |

Data=
2016/04/26 15:45:36.780, data, data, data, ····
2016/04/26 15:45:36.790, data, data, data, ····
2016/04/26 15:45:36.800, data, data, data, ····
2016/04/26 15:45:36.810, data, data, data, ····
2016/04/26 15:45:36.820, data, data, data, ····

Time stamp | Operation Data

FIG. 6

| Step No | 000 | ....... | 005 | 006 | 007 |
|---|---|---|---|---|---|
| Step Name | D. READY | ....... | D. GAS STAB | D. CALL Sio | |
| Step Time (s) | 1.00 | ....... | 1.00 | 0.00 | |
| ....... | ....... | ....... | ....... | ....... | ....... |
| Log flag | | | Start | | End |
| Sampling period (msec) | – | – | 100 | – | 100 |

Shift Recipe

| Step No | 013 | 014 | 015 | 016 |
|---|---|---|---|---|
| Step Name | D. READY | D. SrcFeed | D. SrcPurge | RF ON |
| Step Time (s) | 0.10 | 0.20 | 0.30 | 0.20 |
| ....... | ....... | ....... | ....... | ....... |
| Sampling period (msec) | 50 | 50 | 50 | 10 |

SUBSTRATE PROCESSING SYSTEM, STORAGE MEDIUM AND DATA PROCESSING METHOD

BACKGROUND OF THE INVENTION

Field

The present invention relates to a substrate processing system, a storage medium and a data processing method used to process a substrate.

Background

Patent Literature 1: US 2009/055013 A discloses a substrate processing system provided with a main control apparatus (unique platform controller (UPC)) and a module controller. The main control apparatus and the module controller control a plurality of modules.

There are cases where operation data of a module is sent to a host computer and a user may analyze the operation data using the host computer. Considering that the user analyzes waveform data, operation data sampled for every 10 msec may be preferable to operation data sampled for every 100 msec, for example. That is, it is preferable to sample operation data in a shorter period. However, depending on a device that makes up the substrate processing system, there is a problem that data cannot be transferred in a short period, for example, 10 msec.

SUMMARY OF THE INVENTION

The present invention has been implemented to solve the above-described problem and it is an object of the present invention to provide a substrate processing system, a storage medium and a data processing method capable of providing operation data sampled in a short period to a host computer.

The features and advantages of the present invention may be summarized as follows.

According to one aspect of the present invention, a substrate processing system includes a module controller that creates a log file in which a data count corresponding to timing of sampling operation data is added to the operation data of a module sampled in a predetermined sampling period, a main control apparatus that is connected to the module controller, receives the log file and start time information indicating a time at which collection of the operation data included in the log file starts from the module controller, converts the data count to a time stamp from the start time information and creates a data file including the time stamp and the operation data, and a host computer that receives the data file provided from the main control apparatus.

According to another aspect of the present invention, a computer-readable recording medium that records a program, the program causing a computer to execute a log file creating step of creating a log file in which a data count corresponding to timing of sampling operation data is added to the operation data of a module sampled in a predetermined sampling period, a data file creating step of converting the data count to a time stamp from start time information indicating a time at which collection of the operation data included in the log file starts and creating a data file including the time stamp and the operation data, and a sending step of sending the data file to a host computer.

According to another aspect of the present invention, a data processing method includes a step of acquiring operation data of a module in a predetermined sampling period, a step of creating a log file in which a data count corresponding to timing of sampling the operation data is added to the operation data, a step of converting the data count to a time stamp from start time information indicating a time at which collection of the operation data included in the log file starts and creating a data file including the time stamp and the operation data, and a step of sending the data file to a host computer.

Other and further objects, features and advantages of the invention will appear more fully from the following description.

BRIEF DESCRIPTION OF THE DRAWINGS

FIG. 2 is a diagram illustrating contents of the log file;
FIG. 3 is a diagram illustrating a method for converting a data count to a time stamp;
FIG. 5 is a block diagram of a substrate processing system according to a second embodiment;
and
FIG. 6 is a table illustrating an example of the recipe data.

DETAILED DESCRIPTION OF THE PREFERRED EMBODIMENTS

Figure 1:
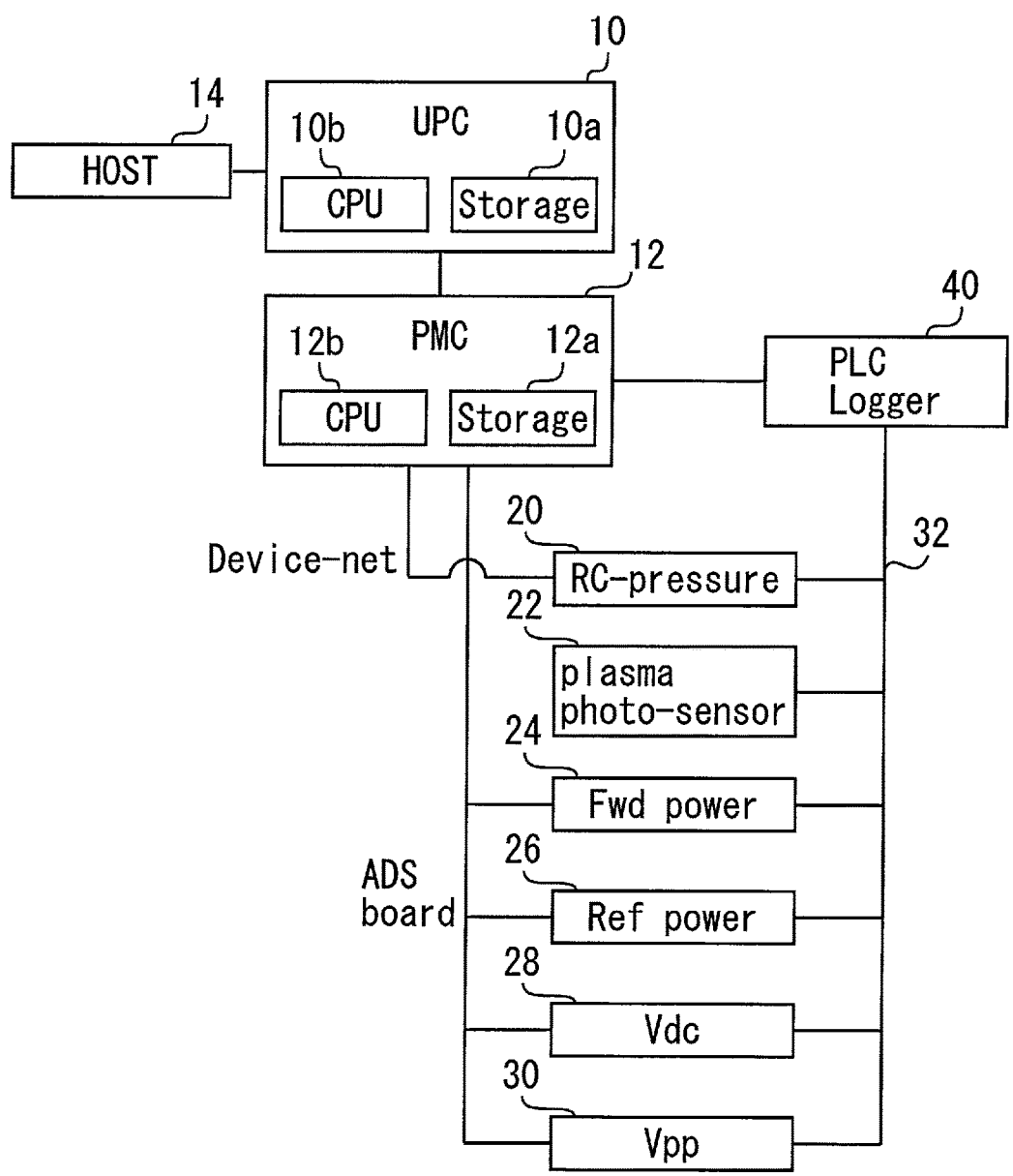
FIG. 1 is a block diagram of a substrate processing system according to a first embodiment.

A substrate processing system, a storage medium and a data processing method according to an embodiment of the present invention will be described with reference to the accompanying drawings. Identical or corresponding components are assigned identical reference numerals and duplicate description may be omitted.

First Embodiment

FIG. 1 is a block diagram of a substrate processing system according to a first embodiment. The substrate processing system is provided with a main control apparatus 10. The main control apparatus 10 is constructed of, for example, a UPC. A module controller 12 and a host computer 14 are connected to the main control apparatus 10. The module controller 12 may be a transfer module controller which controls a transfer system module, but the module controller 12 here is assumed to be a process module controller (PMC).

The substrate processing system according to the first embodiment of the present invention includes a plurality of modules. A module 20 is a pressure gauge that measures a pressure of a reaction chamber. A module 22 is a plasma photosensor that detects energy of plasma. A module 24 is a measuring instrument that observes a traveling wave (forward power) of an RF voltage. A module 26 is a measuring instrument that observes a reflected wave. Modules 28 and 30 are measuring instruments that measure RF-related data.

Modules 20, 24, 26, 28 and 30 are connected to the module controller 12. The module controller 12 and the modules 24, 26, 28 and 30 are connected via an ADS board, whereas the module controller 12 and the module 20 are connected via, for example, a device net manufactured by OMRON Corporation. Modules requiring accurate synchronization with a recipe are generally connected to the ADS board and modules not requiring accurate synchronization with a recipe are connected to the device net.

A PLC (programmable logic controller) 40 is connected to the modules 20, 22, 24, 26, 28 and 30 via a connection line 32. The PLC 40 functions as a logger that samples and saves operation data which is data measured by the modules. Operation data sampled by the modules 20 to 30 is RF data of the reaction chamber. Therefore, for example, plasma light emission intensity, forward power or the like may become operation data. The PLC 40 can sample operation data of the modules 20 to 30 in any given sampling period, for example, 100 msec, 10 msec or 1 msec. However, the PLC 40 cannot send operation data sampled in a short sampling period, for example, 10 msec to the module controller 12 in real time.

The module controller 12 is connected to the PLC 40. The module controller 12 controls the modules 20, 24, 26, 28 and 30 and samples operation data from the modules 20, 24, 26, 28 and 30 at the same time. More specifically, the module controller 12 samples operation data from the modules 20, 24, 26, 28, 30 via the ADS board or the device net in a period of, for example, 100 msec. The UPC 10 monitors a waveform of the sampled operation data in real time. A data sampling period of on the order of 100 msec is sufficient for real-time monitoring. Since a data exchange period between the module controller 12 and the ADS board is 50 msec at minimum, it is not possible to provide data to the module controller 12 in a shorter period.

The substrate processing system according to the first embodiment of the present invention provides operation data sampled in a short period to the host computer 14 in order for the user to analyze the operation data in detail using the host computer 14 in addition to such real-time monitoring. In the first embodiment of the present invention, operation data sampled in a short period, for example, 10 msec is assumed to be a "data file" and the data file is provided to the host computer 14. Hereinafter, a process of generating the data file will be described.

(Data File Generation Process)

First, the PLC 40 samples operation data of the modules 20 to 30 in a predetermined sampling period. In the first embodiment, the PLC 40 samples operation data of the modules 20 to 30 in a sampling period of 10 msec. Every time the PLC 40 samples a certain number of pieces of operation data, the PLC 40 provides the operation data to the module controller 12. The PLC 40 collectively provides the operation data to the module controller 12 for every 100 msec, for example.

Next, the module controller 12 adds a data count according to operation data sampling timing to the operation data of the modules 20 to 30, and thereby generates a log file. FIG. 2 is a diagram illustrating contents of the log file. "DI data" is data indicating whether the RF is on or off when operation data is sampled. "RF data" is RF-related data. "Additional AI data" is a pressure of a reaction chamber measured by, for example, the module 20. Operation data includes DI data, RF data and Additional AI data. A data count "0" is added to first operation data. A data count "1" is added to second sampled operation data. A data count "2" is added to third sampled operation data. Thus, a data count is added according to operation data sampling timing. In this way, a log file is generated in which operation data and data counts are associated with each other.

FIG. 2 also describes "RF ON Time." "RF ON Time" is start time information indicating a time at which collection of operation data included in the log file starts. Timing at which collection of operation data starts can be timing at which the RF is first turned on by an operation following a recipe. In the case of FIG. 2, it can be seen that the operation data assigned the data count 0 is sampled by the PLC 40 at 15:45:36.78. In one embodiment, the PLC 40 can transmit signal to the module controller 12 at the beginning of operation data acquisition. Then, the module controller 12 generates the start time information corresponding to the time at which the signal is received by the module controller 12.

Next, the module controller 12 sends the log file and the start time information to the main control apparatus 10. Alternatively, the module controller 12 creates a log file and start time information in the main control apparatus 10. Then, the main control apparatus 10 converts the data count to a time stamp from the start time information and creates a data file having a time stamp and operation data.

FIG. 3 is a diagram illustrating a method for converting a data count to a time stamp. A time point at which the data count is "0" is caused to match 15:45:36.78 which is the start time information. After that, 10 msec is added every time the data count is incremented by 1 to thereby obtain a time stamp shown in the field at a right end in FIG. 3.

Figure 4:
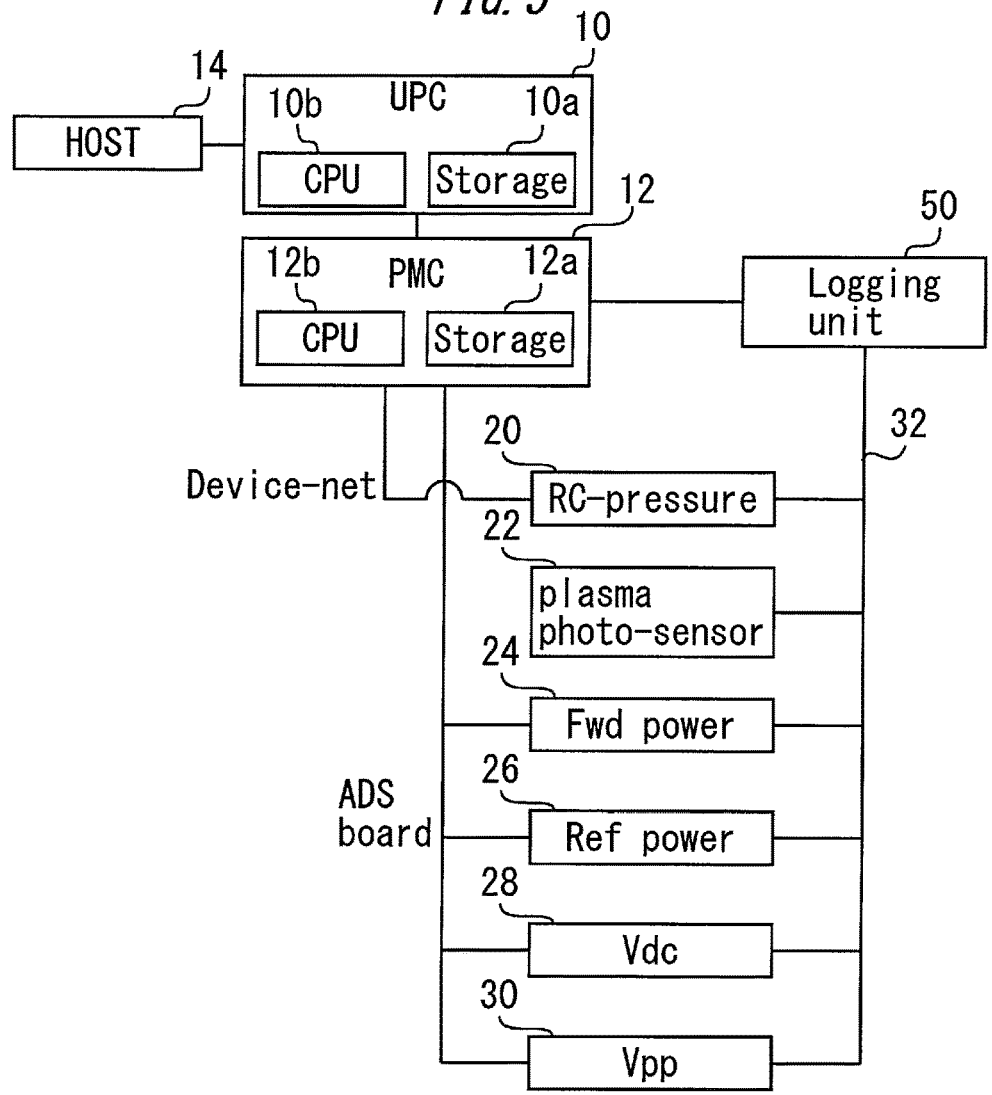
FIG. 4 is a diagram illustrating the data file.

The main control apparatus 10 replaces the data count by a time stamp and thereby creates a data file. FIG. 4 is a diagram illustrating the data file. The data file includes time stamps and operation data. Time stamps are added to all operation data. As shown in FIG. 4, each time stamp preferably includes both a date and a time. Such date information may be added to each data file by adding the data of the date to the start time information in FIG. 2 and by simply incorporating the data of the date into each data file.

Next, the main control apparatus 10 sends the data file to the host computer 14. Timing at which the main control apparatus 10 sends the data file to the host computer 14 preferably coincides with timing at which operation according to a recipe ends. That is, the data file is sent to the host computer 14 at timing at which one process ends.

Such a series of processes are executed based on a program recorded in a computer-readable recording medium. Such a program is recorded, for example, in a recording medium 12a of the module controller 12 and a recording medium 10a of the main control apparatus 10. The program recorded in the recording medium 12a and recording medium 10a cause a computer 12b made up of a CPU and computer 10b made up of CPU to execute the following steps.

(1) Log file creation step of causing the module controller 12 to create a log file in which a data count is added to operation data of a module (2) Data file creation step of causing the main control apparatus 10 to convert the data counts to time stamps from start time information and create a data file including time stamps and operation data (3) Sending step of causing the main control apparatus 10 to send the data file to the host computer 14

The program recorded in the recording medium 12a causes a computer 12b to execute the Log file creation step. The program recorded in the recording medium 10a causes a computer 10b to execute the Data file creation step and the Sending step.

Such processes based on the program are started at timing at which, for example, a process based on a recipe starts. Note that the recording medium 12a and the computer 12b may be provided in a part other than the module controller 12, and that recording medium 10a and the computer 10b may be provided in a part other than the main control apparatus 10.

(Features of Data File)

In the substrate processing system according to the first embodiment of the present invention, the module controller 12 sends a log file to the main control apparatus 10 and the main control apparatus 10 adds time stamps to operation data to create a data file. The host computer 14 cannot analyze the data count as is, but adding time stamps allows the host computer 14 to analyze operation data.

As described above, the PLC 40 cannot send operation data sampled in a short sampling period, for example, 10 msec to the module controller 12 in real time. However, in the substrate processing system according to the first embodiment of the present invention, the PLC 40 collectively sends the operation data to the module controller 12. The PLC 40 can provide 10 pieces of operation data sampled in a short sampling period, for example, 10 msec to the module controller 12 in a period of 100 msec. This allows the host computer 14 to handle operation data sampled in a short period as an analysis target.

Moreover, as shown in FIG. 3, it is possible to collectively convert data counts to time stamps using a calculation expression, and thereby efficiently create a data file. By changing 10 msec which is an increment of the calculation expression, it is possible to easily adapt to a change in the sampling period of operation data. For example, if the increment of the calculation expression is set to 1 msec, it is possible to provide operation data sampled in a shorter period to the host computer 14. The calculation expression whereby the increment is set to 1 msec is as follows.

Time stamp=start time+1 msec×data count (Modifications)

In the first embodiment of the present invention, RF data of the reaction chamber is assumed as operation data. However, other data may also be assumed as operation data. That is, the data the user wants to analyze in detail may be assumed as operation data. For example, data of PT-BT (pressure transducer bottle) may also be assumed as operation data. The data of PT-BT is pressure data in a pipe between a bottle filled with gas and the reaction chamber. By assuming as operation data, a detection value of a pressure sensor that monitors a pressure inside the reaction chamber from a secondary side of the bottle, it is possible to monitor the pipe between the reaction chamber and the bottle so as not be overpressurized.

Although, operation data of the modules is sampled by the PLC 40, an entity that samples operation data is not limited to the PLC 40. That is, operation data can be sampled by a computer which is different from the PLC 40. The sampling period for the PLC 40 to sample operation data is set to 10 msec, but any given period can be set as the sampling period. For example, a sampling period of 1 msec may be set.

These modifications are applicable to a substrate processing system, a storage medium and a data processing method according to the following embodiment as appropriate. Note that the substrate processing system, the storage medium and the data processing method according to the following embodiment have many points common to the first embodiment, and therefore the following description will be given mainly focused on differences from the first embodiment.

Second Embodiment

FIG. 5 is a block diagram of a substrate processing system according to a second embodiment. This substrate processing system is provided with a logging unit 50 connected to the modules 20 to 30 via the connection line 32. The logging unit 50 samples operation data from the modules 20 to 30 in a predetermined sampling period. In addition to the same function as that of the PLC 40 in the first embodiment, the logging unit 50 can receive recipe data provided from the module controller 12 and change the sampling period according to the recipe data.

FIG. 6 is a table illustrating an example of the recipe data provided from the module controller 12 to the logging unit 50. Steps 000 to 007 are described on an upper row in FIG. 6 and step 006 includes steps 013 to 016 described on a lower row in FIG. 6. A log file is created in steps 005, 006 and 007. Step 005 and step 007 are steps of stabilizing a gas in the reaction chamber, and need not be analyzed in detail by the host computer 14, and so operation data need not be sampled in a short period. Thus, in steps 005 and 007, the sampling period of operation data is set to a relatively large value such as 100 msec.

Step 013 is a preparation step for RF application. Step 014 is a step of supplying a material gas called a "source feed." Step 015 is a cleaning step called a "source purge." Step 016 is an RF step of applying RF to an RF plate. In steps 013 to 015, the sampling period of operation data is set to a relatively small value such as 50 msec. In step 016, the sampling period of operation data is set to a small value such as 10 msec.

Thus, the logging unit 50 changes the sampling period of operation data according to the received recipe data. More specifically, the sampling period is shortened in steps requiring detailed operation data and the sampling period is increased in steps not requiring detailed operation data or sampling of operation data itself is not executed. The aforementioned operation is possible, for example, by causing the program recorded in the recording medium 12*a* to change the sampling period according to the recipe.

In a recipe shown in FIG. 6, a logging start flag is incorporated in step 005 and a logging end flag is incorporated in step 007. The step in which the logging start flag is incorporated is called a "first step" and the step in which the logging end flag is incorporated is called a "second step." The logging unit 50 logs operation data from the first step to the second step and does not log operation data in other steps.

In this way, the module controller 12 sends the recipe data to the logging unit 50 and the logging unit 50 changes the sampling period of operation data according to contents of the recipe data. That is, information on the sampling period of the operation data is added to each step of the recipe and the logging unit 50 reads the sampling period of the operation data for each step and samples the operation data in the sampling period. It is thereby possible to sample operation data in a short period in steps requiring detailed analysis such as when plasma is produced, and increase the sampling period of operation data in other steps.

Obviously many modifications and variations of the present invention are possible in the light of the above teachings. It is therefore to be understood that within the scope of the appended claims the invention may be practiced otherwise than as specifically described.

What is claimed is:

1. A substrate processing system comprising:
   a module controller that creates a log file in which a data count corresponding to timing of sampling operation data is added to the operation data of a module sampled in a predetermined sampling period, the operation data including data pertaining to a parameter representing a physical characteristic associated with a chamber, as measured by the module;
   a main control apparatus that is connected to the module controller, receives the log file and start time information indicating a time at which collection of the operation data included in the log file starts from the module controller, converts the data count to a time stamp from the start time information and creates a data file including the time stamp and the operation data; and
   a host computer that receives the data file provided from the main control apparatus and analyzes the data file.

2. The substrate processing system according to claim 1, wherein the sampling period is 10 msec or less.

3. The substrate processing system according to claim 1, wherein the operation data is RF data of a reaction chamber.

4. The substrate processing system according to claim 1, wherein the operation data is a pressure in a pipe between a bottle filled with gas and a reaction chamber.

5. The substrate processing system according to claim 1, further comprising:
a programmable logic controller that samples the operation data in the sampling period;
a connection line that connects the programmable logic controller with the module; and
an ADS board that connects the module controller with the module,
wherein the programmable logic controller collectively sends the operation data to the module controller.

6. The substrate processing system according to claim 1, further comprising:
a logging unit that samples the operation data in the sampling period; and
a connection line that connects the logging unit with the module,
wherein the module controller sends recipe data to the logging unit, and
the logging unit changes the sampling period according to the recipe data.

7. The substrate processing system according to claim 6, wherein the recipe data comprises a first step in which a logging start flag is incorporated and a second step in which a logging end flag is incorporated, and
the logging unit logs the operation data from the first step to the second step.

8. A computer-readable recording medium that records a program, the program causing a computer to execute:

a log file creating step of creating a log file in which a data count corresponding to timing of sampling operation data is added to the operation data of a module sampled in a predetermined sampling period, the operation data including data pertaining to a parameter representing a physical characteristic associated with a chamber, as measured by the module;
a data file creating step of converting the data count to a time stamp from start time information indicating a time at which collection of the operation data included in the log file starts and creating a data file including the time stamp and the operation data; and
a sending step of sending the data file to a host computer which analyzes the data file.

9. The storage medium according to claim 8, wherein the program changes the sampling period according to a recipe.

10. A data processing method comprising:
a step of acquiring operation data of a module in a predetermined sampling period, the operation data including data pertaining to a parameter representing a physical characteristic associated with a chamber, as measured by the module;
a step of creating a log file in which a data count corresponding to timing of sampling the operation data is added to the operation data;
a step of converting the data count to a time stamp from start time information indicating a time at which collection of the operation data included in the log file starts and creating a data file including the time stamp and the operation data; and
a step of sending the data file to a host computer which analyzes the data file.

11. The data processing method according to claim 10, wherein the sampling period is changed according to a recipe.

* * * * *